United States Patent [19]

Ishii

[11] Patent Number: 5,008,673
[45] Date of Patent: Apr. 16, 1991

[54] DIGITAL TO ANALOG CONVERTER ENHANCING CONVERSION PRECISION

[75] Inventor: Eiichi Ishii, Tokyo, Japan

[73] Assignee: NEC Corporation, Tokyo, Japan

[21] Appl. No.: 314,148

[22] Filed: Feb. 22, 1989

[30] Foreign Application Priority Data

Feb. 26, 1988 [JP] Japan .................................. 63-44995

[51] Int. Cl.⁵ .............................................. H03M 1/66
[52] U.S. Cl. ...................................... 341/144; 341/118
[58] Field of Search ................. 341/118, 144, 146, 147

[56] References Cited

U.S. PATENT DOCUMENTS 3,588,882  6/1971  Propster .............................. 341/147
4,229,703  10/1980  Bustin ................................. 341/118
4,791,406  12/1988  Mehrgardt et al. ................. 341/144
4,827,260  5/1989  Sugawa et al. ..................... 341/118

Primary Examiner—A. D. Pellinen
Assistant Examiner—Marc S. Hoff
Attorney, Agent, or Firm—Helfgott & Karas

[57] ABSTRACT

A digital-to-analog converter which includes a plurality of flip-flops each temporarily storing the corresponding bit data of digital data to be converted into an analog signal and producing true and complementary outputs relative to the stored data, the true outputs from the respective flip-flops being added with each other by a first adder and the complementary outputs from the respective flip-flops being added with each other by a second adder, and a subtracter subtracting the output from the second adder from the output from the first adder to obtain a final analog signal.

7 Claims, 3 Drawing Sheets

DIGITAL TO ANALOG CONVERTER ENHANCING CONVERSION PRECISION

BACKGROUND OF THE INVERSION

1. Field of the Invention

The present invention relates to a digital-to-analog converter (called hereinafter "DAC") and, more particularly, to an improvement in conversion precision of the DAC.

2. Description of the Related Art

As the bit resolution required to a DAC becomes severe, the DAC becomes more complicated and expensive. Therefore, in a digital audio field particularly, an over-sampling technique has been employed as well-known in the art to obtain a high bit resolution and to reproduce an analog signal by using a DAC of low bit resolution. For example, in a case where a 16-bit resolution is required at a conversion rate of $f_1$, if the audio signal is over-sampled to be converted into a two-bit digital signal at a conversion rate of $f_2$ that is 128 times as large as $f_1$, $f_2 = 128 \times f_1$, the digital signal can be reproduced as the analog audio signal equivalent to that converted from the 16-bit resolusion digital signal. More specifically the over-sampled two-bit digital signal is converted into an analog, signal by two-bit DAC and then being subjected to a low-pass filter.

Referring to FIG. 1, there is shown a 2-bit DAC suitable for converting the over-sampled two-bit digital signal into an analog signal. The two-bit digital data GD having first and second bits $D_0$ and $D_1$ is supplied to a set of input terminals 1-1 and 1-2 at a rate that is equal to the clock rate of a clock signal CK but advances in phase by a half cycle period of the clock signal CK. The input terminals 1-1 and 1-2 are connected to a decoder 2 which decodes the digital data GD to produce decoded data $DD_0$ to $DD_2$ as shown in TABLE below.

TABLE

| $D_0$ | $D_1$ | $DD_0$ | $DD_1$ | $DD_2$ |
|---|---|---|---|---|
| 0 | 0 | 0 | 0 | 0 |
| 1 | 0 | 1 | 0 | 0 |
| 0 | 1 | 1 | 1 | 0 |
| 1 | 1 | 1 | 1 | 1 |

The decoded data $DD_0$ to $DD_2$ are supplied to data terminals D of flip-flops (FFs) 5 to 7, respectively. These FFs 5 to 7 latch the decoded data $DD_0$ to $DD_2$ supplied thereto in synchronism with the leading edge of the clock signal CK supplied to clock terminals $\phi$ thereof. When each of the FFs 5 to 7 latches the corresponding decoded data DD of "1", it produces a predetermined constant voltage (or current) of the same value at its Q output terminal. On the other hand, each of the FFs 5 to 7 produces zero voltage (or current) when it latches the decoded data of "0". The outputs derived from the FFs 5 to 7 are added with each other by an adder 8 and the added result is derived via an output terminal 9 as an analog signal A. Thus, the digital data GD is converted into the analog signal A whose voltage (or current) value (or amplitude) is changed in accordance with the numeral represented by the digital data GD.

However, the DAC shown in FIG. 1 has a disadvantage that the conversion precision is interior. More specifically, when the decoded data DD changes from "0" to "1", the output of the corresponding FF 5, 6 or 7 raises from zero voltage (current) to the predetermined voltage (current) value. On the other hand, the output of the FF 5, 6 or 7 falls from the predetermined voltage (current) value to zero voltage (current) in response to the change of the decoded data DD from "1" to "0". As well known in the art, the raising speed of the output of the FF is not equal to the falling speed thereof. For example, as the output waveform of the FF 7 is shown in FIG. 2, the output of the FF 7 raises up to the predetermined voltage (current) value VA at a relatively slow speed, whereas falls down to zero voltage (current) immediately. For this reason, the integrated value of the output from the FF 7 obtained during one clock period when the decode data $DD_2$ of the same logic level appears first is not coincident with that during one clock period when the decoded data $DD_2$ of the same logic level appears successively, as apparent from the comparison between periodes $T_1$ and $T_2$ or $T_3$ and $T_4$ shown in FIG. 2.

SUMMARY OF THE INVENTION

Therefore, an object of the present invention is to provide a DAC enhancing conversion precision.

Another object of the present invention is to provide a DAC which is allowed to use a flip-flop whose output raises at a first speed and falls at a second speed different from the first speed.

Still another object of the present invention is to provide a DAC of high precision suitable for operating in a over-sampling mode.

A DAC according to the present invention comprises a plurality of flip-flops each temporarily storing corresponding bit data of digital data to be converted and producing true and complementary outputs relative to the stored data, a first adder adding the true outputs from the respective flip-flops with each other, a second adder adding the complementary outputs from the respective flip-flops, and a subtracter producing a signal relative to a substraction between outputs of the first and second adders.

Thus, the difference between the raising and falling speeds of the output of each flip-flop can be compensated by performing the substraction between the true and complementary outputs of each flip-flop, so that the analog signal obtained from the subtracter is free from the amplitude deviation. The conversion precision of the DAC is thereby enhanced.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE EMBODIMENTS

Figure 1:
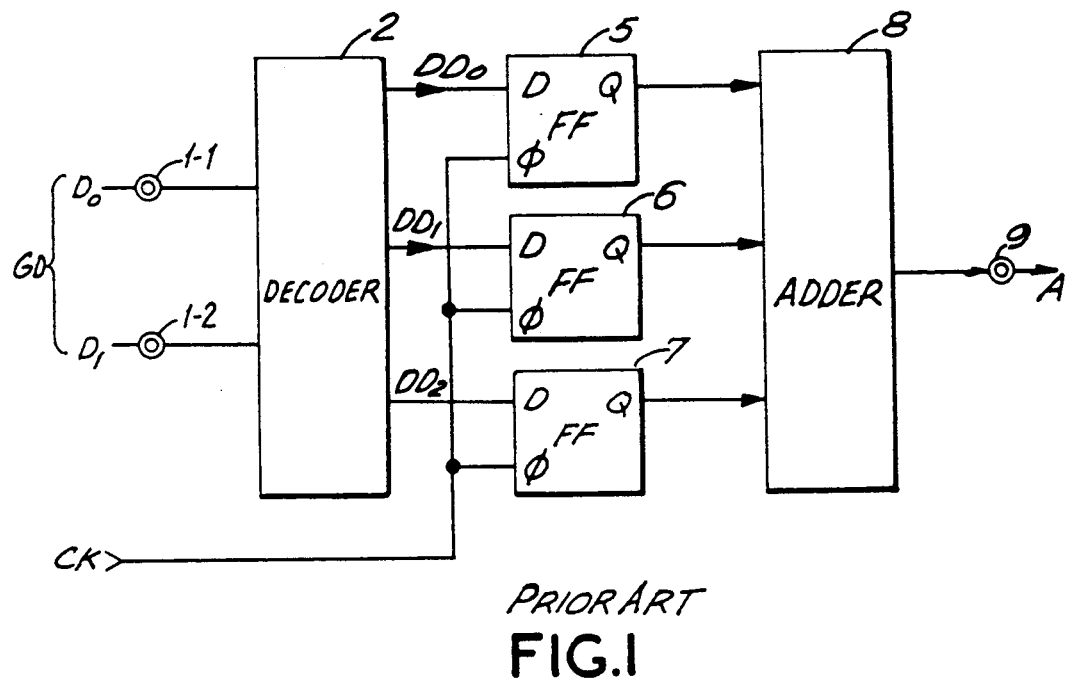
FIG. 1 is a block diagram representative of a DAC according to prior art.
Figure 3:
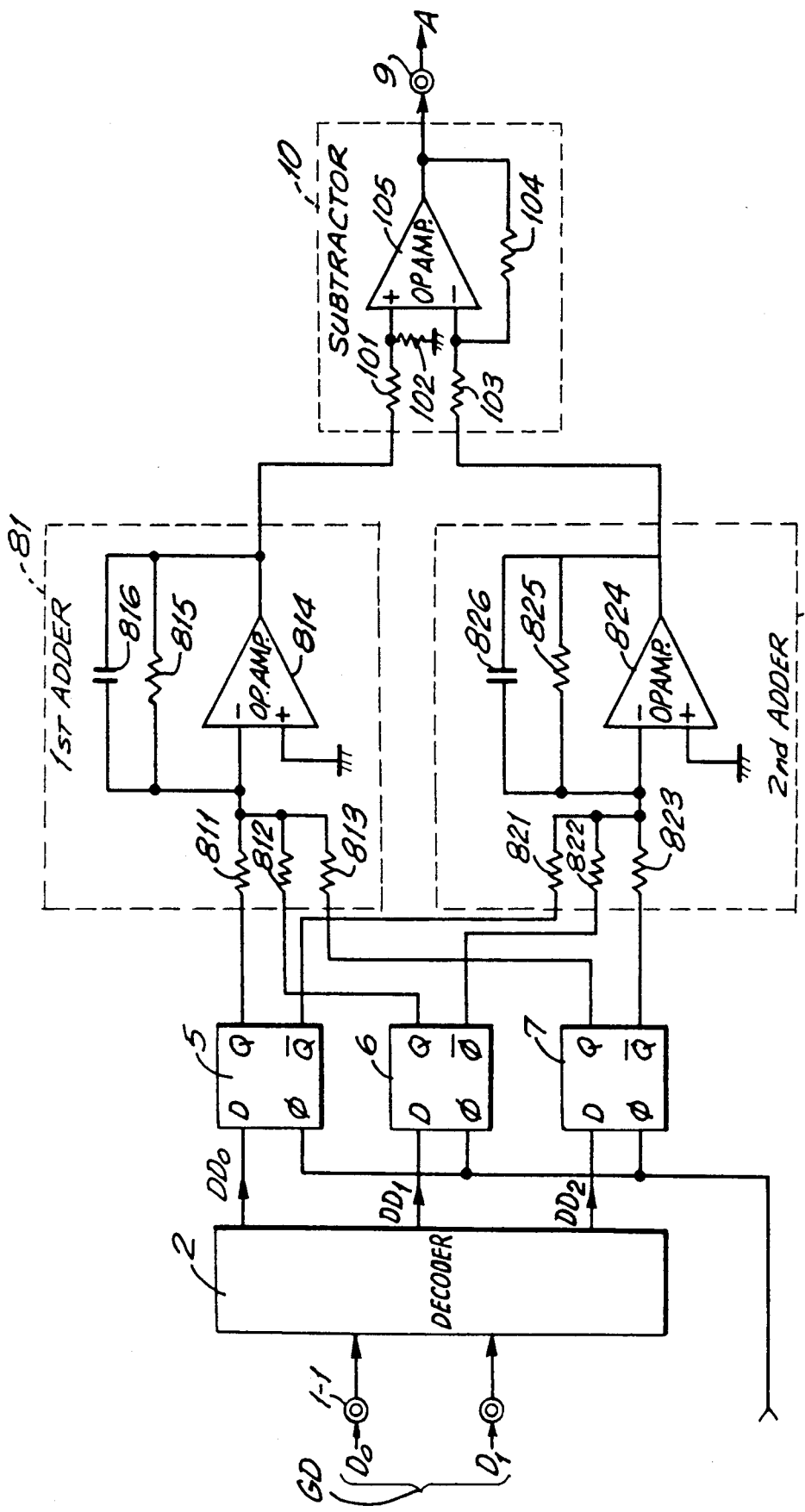
FIG. 3 is a circuit diagram representative of a DAC according to an embodiment of the present invention.
Figure 4:
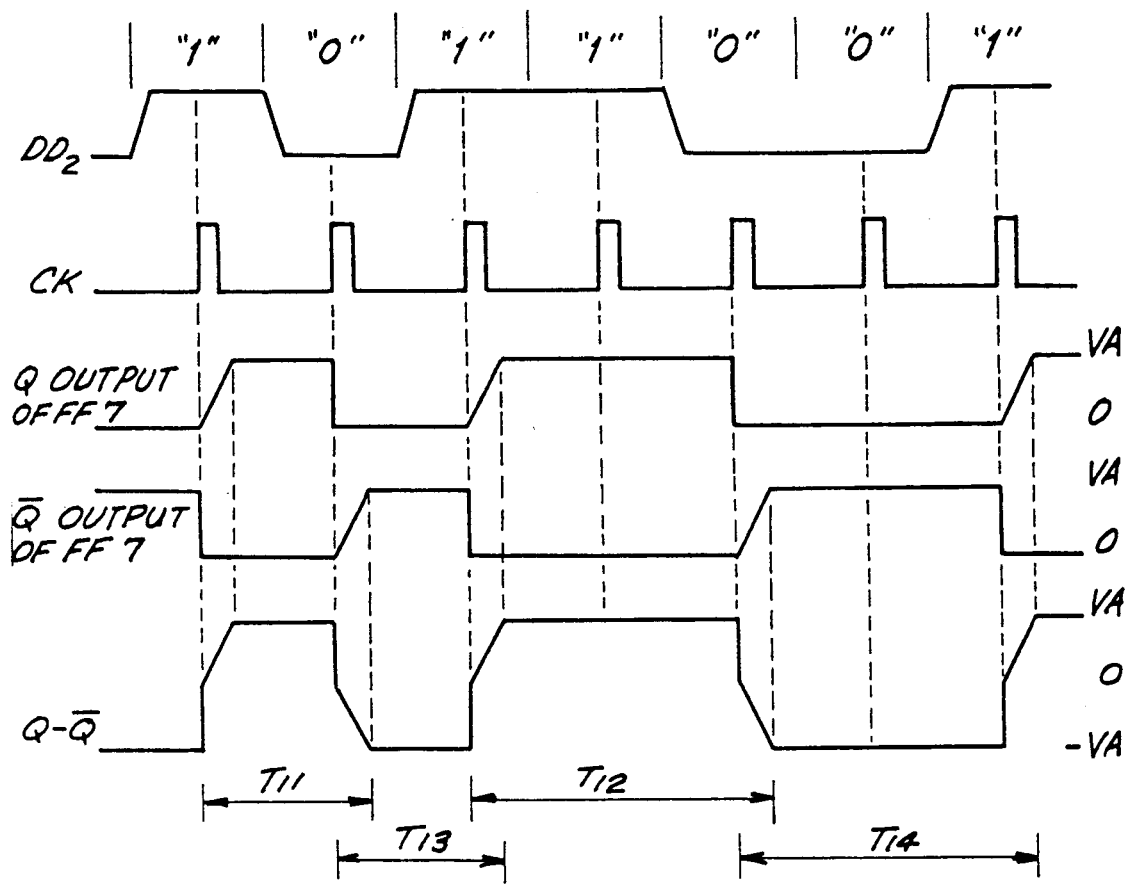
FIG. 4 is a timing chart representative of an operation of the DAC shown in FIG. 3.

Referring to FIG. 3, there is shown a DAC according to an embodiment of the present invention, in which the same constituents as those shown in FIG. 1 are denoted by the same reference numerals to omit further description thereof. In the illustrated DAC, each of the FFs 5 to 7 further has a $\overline{Q}$ output terminal from which the complementary output to the true output at the Q terminal is derived. That is, each of the FFs 5 to 7 produces at the $\overline{Q}$ terminal zero voltage (current) when producing at the Q terminal the predetermined voltage (current) VA or produces at the $\overline{Q}$ terminal the predetermined voltage (current) VA when producing at the Q terminal zero voltage (current). Moveover, the $\overline{Q}$ terminal of each of FFs 5, 6 and 7 raises up to the voltage (current) VA at the substantially same speed as the raising speed of the Q terminal and falls down to zero voltage (current) at the substantially same speed as the falling speed of the Q terminal, as the Q and $\overline{Q}$ outputs of the FF 7 are shown in FIG. 4. The true outputs derived from the respective Q terminals of the FFs 5 to 7 are supplied to a first adder 81 and the complementary outputs derived from the respective $\overline{Q}$ terminals of the FFs 5 to 7 are supplied to a second adder 82. The first adder 81 includes four resistors 811, 812, 813 and 815, one operational amplifier (OP Amp) 814 and one capacitor 816 to obtain both of adder and low-pass filter operations. One ends of the resistors 811 to 813 are connected respectively to the Q terminals of the FFs 5 to 7 and the other ends thereof are connected in common to a inverting input terminal (−) of the OP Amp 814 having a non-inverting input terminal (+) grounded. The resistor 815 and capacitor 816 are connected in parallel between the terminal (−) and an output terminal of the OP Amp 814. Thus, the first adder 81 adds the true output of the FFs 5 to 7 with each other and further operates as a low-pass filter with respect to the added result. The second adder 82 includes four resistors 821, 822, 823 and 825, one operational amplifier (OP Amp) 824 and one capacitor 826 to similarly obtain both of adder and low-pass filter operations. One ends of the resistors 821 to 823 are connected respectively to the $\overline{Q}$ terminals of the FFs 5 to 7 and the other ends thereof are connected in common to the inverting input terminal (−) of the OP Amp 824 whose non-inverting input terminal (+) is grounded. The resistor 825 and the capacitor 826 are connected in parallel between the input (−) and output of the OP Amp 824. Therefore, the second adder 82 adds the complementary outputs of the FFs 5 to 7 with each other and also operates a low-pass filter with respect to the added result. The resistance values of the resistors 811 to 813 and 821 to 823 are equal to one another and the capacitance values of the capacitors 816 and 826 are equal to each other. The resistance values of the resistors 815 and 825 are equal to each other. The outputs derived from the first and second adder 81 and 82 are supplied to a substracter 10 which includes four resistors 101 to 104 and one operational amplifier (OP Amp) 105. Specifically, the outputs of the first adders 81 and 82 are supplied respectively to the non-inverting and inverting inputs (+) and (−) of the OP Amp 105 via the resistors 101 and 103. The resistor 102 is connected between the input (−) and ground and the resistor 104 is connected between the input (+) and output of the OP Amp 105. The resistance ratio of the resistor 101 to the resistor 102 is equal to that of the resistor 103 to the resistor 104. Thus, the substracter 10 substracts the output of the second adder 82 from the output of the first adder 81. If desired, the outputs of the first and second adders 81 and 82 can be supplied to the (−) and (+) input terminals of the OP Amp 105, respectively. The subtracted result derived from the subtracter 10 is supplied to the output terminal 9.

Since the decoder 2 produces the decoded data $DD_0$ to $DD_2$ according to the digital data GD as shown in the foregoing TABLE, the FF or FFs (5, 6, 7), the number of which corresponds to the numeral represented by the digital data GD, produce at the respective Q terminals the predetermined voltage (current) VA. For example, when the bits $D_0$ and $D_1$ of the digital data GD are "10", only the FF 5 produces the voltage (current) VA at the Q terminal. In a case where the bits $D_0$ and $D_1$ are "11", all the FFs 5 to 7 produces the voltage (currents) VA at the respective Q terminals. Thus, the digital data GD is converted into the analog signal A whose voltage (current) amplitude is controlled by the numeral represented by the digital data GD.

Figure 2:
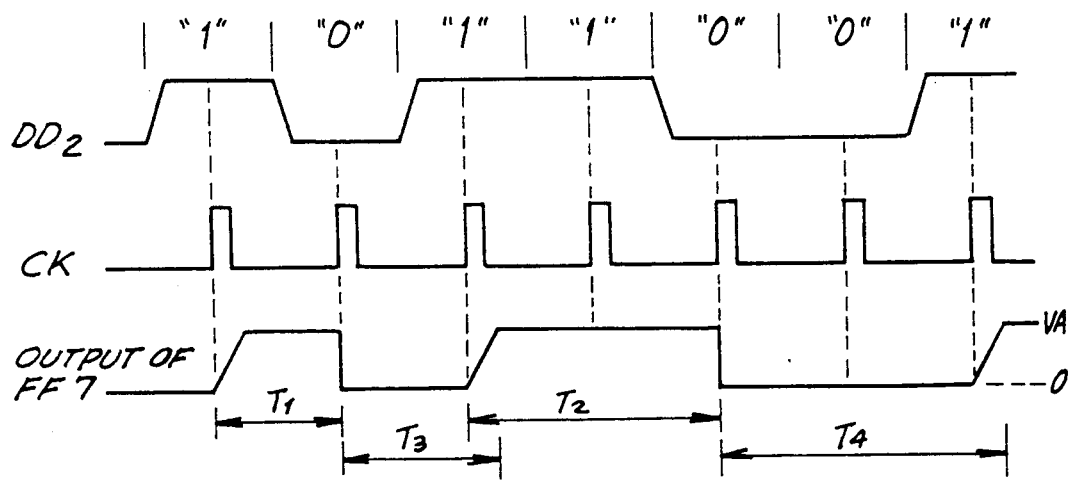
FIG. 2 is a timing chart representative of an operation of a flip-flop shown in FIG. 1.

Moreover, since the subtraction result between the true and complementary outputs of each of the FFs 5 to 7 is utilized as the analog signal A, the conversion precision is remarkably enhanced. More specifically, the true (Q) and complementary ($\overline{Q}$) outputs of the FF 7, for example, are changed as shown in FIG. 2 in response to the decoded data $DD_2$ of "1→0→1→1→0→0→1". Since the subtract 10 performs the subtracting operation on the true and complementary outputs of the FF 7, the subtracted result becomes to the waveform represented as "Q-$\overline{Q}$" shown in FIG. 4. It should be noted, however, that this waveform (Q-$\overline{Q}$) does not appear in fact at any circuit points of the DAC shown in FIG. 3, because each of the adders 81 and 82 has a function of a low-pass filter. In order to facilitate the understanding of the effect and advantage of the present invention, the waveform (Q-$\overline{Q}$) shown in FIG. 4 represents directly the subtraction result between the true and complementary outputs of the FF 7. As apparent from the comparison between periods $T_{11}$ and $T_{12}$ or $T_{13}$ and $T_{14}$ of the waveform (Q-$\overline{Q}$), the ratio of the area of the subtraction result obtained in case where the decoded data $DD_2$ of the same logic level appears successively to the area of the subtraction result obtained in case where the decoded data $DD_2$ of the same logic level appears only one is precisely coincident with the successively appearing time of the decoded data $DD_2$. As a result, the voltage (current) amplitude of the analog signal A is free from the deviation to provide the high conversion precision.

Figure 5:
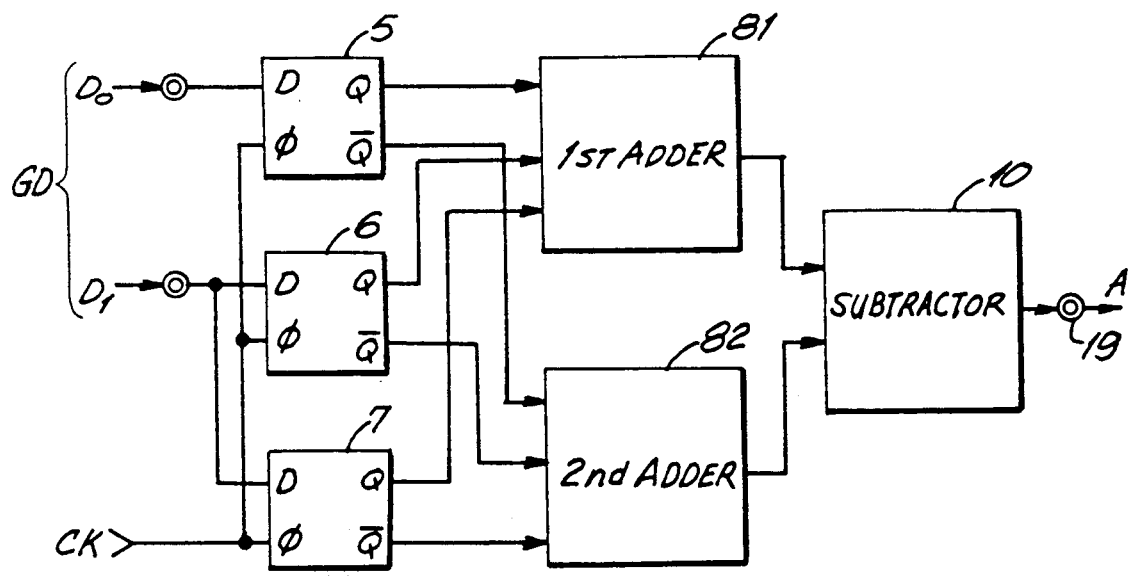
FIG. 5 is a circuit diagram representative of a DAC according to another embodiment of the present invention.

Referring to FIG. 5, a DAC according to another embodiment of the present invention is shown, in which the same constituents as those shown in FIG. 3 are denoted by the same reference numerals to omit the description thereof. This DAC shown in FIG. 5 is different from the DAC of FIG. 3 in that the decoder 2 is removed and the first bit $D_0$ is directly supplied to the FF 5 while the second bit $D_1$ is supplied in common to the FFs 6 and 7. The bits $D_0$ and $D_1$ of "00" cause all the FFs 5 to 7 to produce no voltage (current) at the respective Q outputs. The bits $D_0$ and $D_1$ of "10" cause only the FF 5 to produce the voltage (current) VA at its Q terminal. When the bits $D_0$ and $D_1$ are "01", the FFs 6 and 7 produce the voltage (current) VA at the respective Q terminals. Finally, the bits $D_0$ and $D_1$ of "11" cause all the FFs 5 to 7 to produce the voltage (current) VA at the respective Q terminals. Accordingly, the DAC of FIG. 5 has the same function and effect as the DAC of FIG. 3.

The present invention is not limited to the above embodiment, but may be modified and changed without departing from the scope and spirit of the invention.

We claim:

1. A digital-to-analog converter comprising a plurality of flip-flops, each of said flip-flops temporarily storing corresponding bit data of digital data to be converted and producing true and complementary outputs relative to the stored data, first means coupled to all of said flip-flops for adding the true outputs produced by all of said flip-flops to output a first signal, second means coupled to all of said flip-flops for adding the complementary outputs produced by all of said flip-flops to produce a second signal, and third means coupled to said first and second means for producing an output signal relative to a difference between said first and second signals.

2. A digital-to-analog converter comprising a plurality of flip-flops, each flip-flop temporarily storing corresponding bit data of digital data to be converted and producing true and complementary outputs relative to the stored data, first means coupled to all of said flip-flops for adding the true outputs produced by all of said flip-flops to output a first signal, second means coupled to all of said flip-flops for adding the complementary outputs produced by all of said flip-flops to produce a second signal, and third means coupled to said first and second means for producing an output signal relative to a difference between said first and second signals, said first means including first low-pass filter means for outputting said first signal in an analog form and said second means including second low-pass filter means for outputting said second signal in an analog form.

3. The converter as claimed in claim 2, wherein said third means includes an operational amplifier having a first input terminal supplied with said first signal and a second input terminal supplied with said second signal.

4. A digital-to-analog converter comprising a plurality of flip-flops each having an input terminal, true and complementary output terminals and a clock terminal, means for supplying the input terminal of each of said flip-flops with a corresponding bit of digital data to be converted, means for supplying a clock signal in common to the clock terminals of said flip-flops, first and second amplifiers each having input and output terminals, means for coupling the true output terminals of said flip-flops to the input terminal of said first amplifier, means for coupling the complementary output terminals of said flip-flops to the input terminal of said second amplifier, a first feedback circuit connected between the input and output terminals of said first amplifier, a second feedback circuit connected between the input and output terminals of said second amplifier, a third amplifier having first and second input terminals and an output terminal, means for coupling the output terminals of said first and second amplifiers to the first and second input terminals of said third amplifier, and a converted signal output terminal coupled to the output terminal of said third amplifier.

5. The converter as claimed in claim 4, wherein the first-mentioned coupling means includes a plurality of first resistors each connected between the true output terminal of each of said flip-flops and the input terminal of said first amplifier and the second-mentioned coupling means includes a plurality of second resistors each connected between the complementary output terminal of each of said flip-flops and the input terminal of said second amplifier, said first and second resistors have the same resistance value as one another.

6. The converter as claimed in claim 4, wherein said first feedback circuit includes a resistor and a capacitor connected in parallel between the input and output terminals of said first amplifier and said second feedback circuit includes a resistor and a capacitor connected in parallel between the input and output terminals of said second amplifier.

7. A digital-to-analog converter comprising a plurality of flip-flops, each of said flip-flops latching corresponding digital data in synchronism with a clock signal and producing true and complementary outputs, means responsive to the true outputs from all of said flip-flops for producing a first current, means responsive to the complementary outputs from all of said flip-flops for producing a second current, and means for performing a subtraction operation on said first and second currents to produce a converted analog signal.

* * * * *